US009112500B2

(12) United States Patent
Park

(10) Patent No.: US 9,112,500 B2
(45) Date of Patent: Aug. 18, 2015

(54) METHOD OF OUTPUTTING POSITIONING PULSE BY PLC

(71) Applicant: LSIS CO., LTD., Anyang-si, Gyeonggi-do (KR)

(72) Inventor: Jo Dong Park, Cheonan-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 0 days.

(21) Appl. No.: 14/495,000

(22) Filed: Sep. 24, 2014

(65) Prior Publication Data

US 2015/0200673 A1   Jul. 16, 2015

(30) Foreign Application Priority Data

Jan. 10, 2014   (KR) .................. 10-2014-0003327

(51) Int. Cl.
*G05B 11/01*   (2006.01)
*H03K 19/177*   (2006.01)

(52) U.S. Cl.
CPC ...... *H03K 19/17796* (2013.01); *G05B 2219/25045* (2013.01)

(58) Field of Classification Search
CPC ............. H03K 19/17796; G05B 2219/25045; G05B 19/042
USPC ............................. 700/12–14; 326/38, 93–98
See application file for complete search history.

(56) References Cited

U.S. PATENT DOCUMENTS

| 6,329,785 | B1* | 12/2001 | Starkie et al. ................ 318/811 |
| 2003/0191593 | A1* | 10/2003 | McNutt ........................... 702/75 |
| 2013/0033218 | A1* | 2/2013 | Yamada et al. ............... 318/567 |
| 2013/0090745 | A1* | 4/2013 | Frazer et al. .................... 700/12 |
| 2013/0241570 | A1* | 9/2013 | Okamoto et al. ............. 324/537 |

FOREIGN PATENT DOCUMENTS

KR   10-2010-0103944   9/2010

OTHER PUBLICATIONS

Korean Intellectual Property Office Application Serial No. 10-2014-0003327, Office Action dated Apr. 20, 2015, 4 pages.

* cited by examiner

*Primary Examiner* — Don Le
(74) *Attorney, Agent, or Firm* — Lee, Hong, Degerman, Kang & Waimey

(57) ABSTRACT

A method of outputting a positioning pulse by a programmable logic controller (PLC) is provided. The method includes setting up the desired cycle of a pulse to be output; determining a number of needed clocks based on a number of system clocks and a desired frequency according to the desired cycle; determining a total number of needed clocks based on the number of needed clocks and the desired frequency; determining a clock difference based on the number of system clocks and the total number of needed clocks; determining a first number of setup clocks corresponding to a first output pulse in a certain cycle; determining a second number of setup clocks corresponding to pulses except for the first output pulse; and outputting a pulse based on the first number of setup clocks and the second number of setup clocks.

15 Claims, 6 Drawing Sheets

Fig. 6

| DESIRED FREQUENCY | DESIRED CYCLE | SYSTEM CLOCK NEEDED FOR OUTPUTTING PULSE | SYSTEM CLOCK THAT MAY BE SET UP WHEN OUTPUTTING PULSE | TPU SETUP CYCLE | CLOCK DIFFERENCE WHEN PULSE IS GENERATED FOR ONE SECOND (16.6/clk/pls*3pls = 50clk) |
|---|---|---|---|---|---|
| 3 Hz | 333.33ms (= 1000ms/3) | 16.67 (= 50Hz/3Hz) | 17 (= Round(16.67)) | 340.00ms (= 20ms*17) | 50−51 = −1 clk |

METHOD OF OUTPUTTING POSITIONING PULSE BY PLC

CROSS-REFERENCE TO RELATED APPLICATIONS

Pursuant to 35 U.S.C. §119(a), this application claims the benefit of earlier filing date and right of priority to Korean Patent Application No. 10-2014-0003327, filed on Jan. 10, 2014, the contents of which are hereby incorporated by reference herein in its entirety.

BACKGROUND

The present disclosure relates to a method of outputting a positioning pulse by a programmable logic controller (PLC), and more particularly, to a method of outputting the positioning pulse by a PLC that may compensate for the cycle of the positioning pulse at a certain interval to minimize the difference between the desired cycle of the positioning pulse and the actual output cycle when the desired cycle of the positioning pulse is not a multiple of a system clock cycle.

In general, a programmable logic controller (PLC) provides a positioning function of outputting a high-speed pulse train and operating a motor to move an object to an accurate position.

That is, the positioning function of the PLC is a function of outputting a high-speed pulse train to the transistor output contact of the PLC and operating a motor to move an object to an accurate position.

In this case, when a general-purpose microprocessor unit (MPU) is used, the positioning function is implemented in a timer pulse unit (TPU) that outputs a pulse by using a timer.

The TPU counts the timer by using a clock provided with the MPU and outputs a pulse at a preset time interval.

Thus, the output cycle of a pulse becomes a multiple of a clock cycle and when the output cycle of the pulse is not a multiple of the clock cycle, the difference between the pulse output cycle and the clock cycle is accumulated with the increase of a desired position value and thus a time taken to arrive at a desired position gradually increases or decreases.

SUMMARY

Embodiments provide a method of outputting a positioning pulse by a programmable logic controller (PLC) that may compensate for the cycle of the positioning pulse at a certain interval to minimize the difference between the desired cycle of the positioning pulse and the actual output cycle when the desired cycle of the positioning pulse is not a multiple of a system clock cycle.

In one embodiment, a method of outputting a positioning pulse by a programmable logic controller (PLC) includes setting up the desired cycle of a pulse to be output; determining a number of needed clocks based on a number of system clocks and a desired frequency according to the desired cycle; determining a total number of needed clocks based on the number of needed clocks and the desired frequency; determining a clock difference based on the number of system clocks and the total number of needed clocks; determining a first number of setup clocks corresponding to a first output pulse in a certain cycle; determining a second number of setup clocks corresponding to pulses except for the first output pulse; and outputting a pulse based on the first number of setup clocks and the second number of setup clocks.

The number of needed clocks may be determined by dividing the number of system clocks by the desired frequency.

When the number of needed clocks is not an integer, the number of clocks may be changed to an integer.

The change of the number of needed clocks to the integer may be performed by rounding off to the nearest tenth of the number of needed clocks.

The clock difference may be determined by subtracting the total number of needed clocks from the number of system clocks.

The first number of setup clocks may be determined by compensating for the clock difference from a value obtained by converting the number of needed clocks and the second number of setup clocks may be determined to be a value obtained by converting the number of needed clocks.

The method may further include storing the number of system clocks, the number of desired clocks and the number of needed clocks in a storage unit.

The method may further include setting the first number of setup clocks and the second number of setup clocks as a timer general register (TGR) value.

The details of one or more embodiments are set forth in the accompanying drawings and the description below. Other features will be apparent from the description and drawings, and from the claims.

BRIEF DESCRIPTION OF THE DRAWINGS

FIG. 6 represents values calculated in each step for outputting a pulse according to an embodiment of the present invention.

DETAILED DESCRIPTION OF THE EMBODIMENTS

Figure 1:
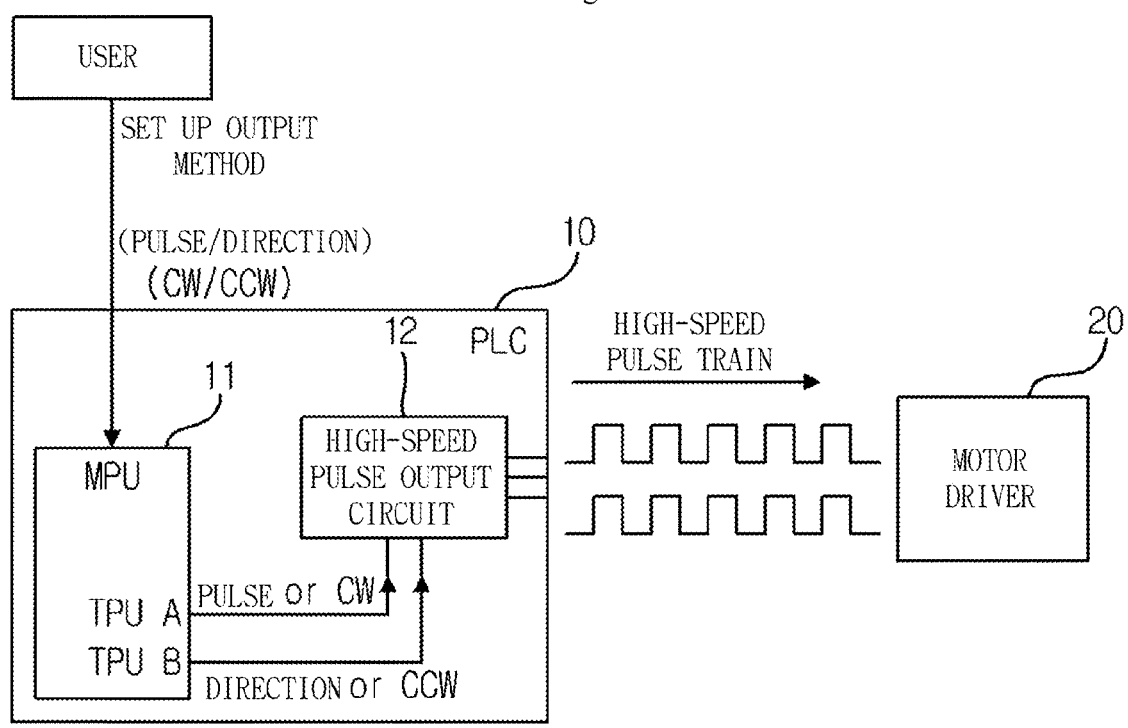
FIG. 1 is a block diagram representing a general programmable logic controller (PLC) positioning system.

Exemplary embodiments are described below in detail with reference to the accompanying drawings so that a person skill in the art may easily practice the present invention. In this process, the thickness of lines or the size of components shown in the drawings may be exaggerated for the clarity and convenience of description. Also, since the terms used herein are defined in consideration of functions in the present invention, they may vary depending on an operator intention or practice. Therefore, the definitions of these terms needs to be made based on details throughout the present invention.

FIG. 1 is a block diagram representing a general programmable logic controller (PLC) positioning system.

Referring to FIG. 1, a PLC positioning system 10 includes a microprocessor unit (MPU) 11 and a high-speed pulse output circuit 12 and the MPU 11 generates a high-speed pulse train according to an output method set by a user.

In this case, the output method may be set as a pulse/direction method or a clockwise/counter clockwise (CW/CCW) output method. In the case of the pulse/direction output method, a terminal TPU A operates as a pulse train output port and the other terminal TPU B operates as a direction output ports, and in the case of the CW/CCW output method, a terminal TPU A operates as a clockwise pulse train output port and the other terminal TPU B operates as a counter clockwise pulse train output port.

The high-speed pulse output circuit 12 is an output signal transfer circuit including a high-speed photo coupler and a transistor, converts a high-speed pulse train transferred from the MPU 11 into a signal level suitable for an external motor driver 20 and transfers it to the motor driver 20.

Figure 2:
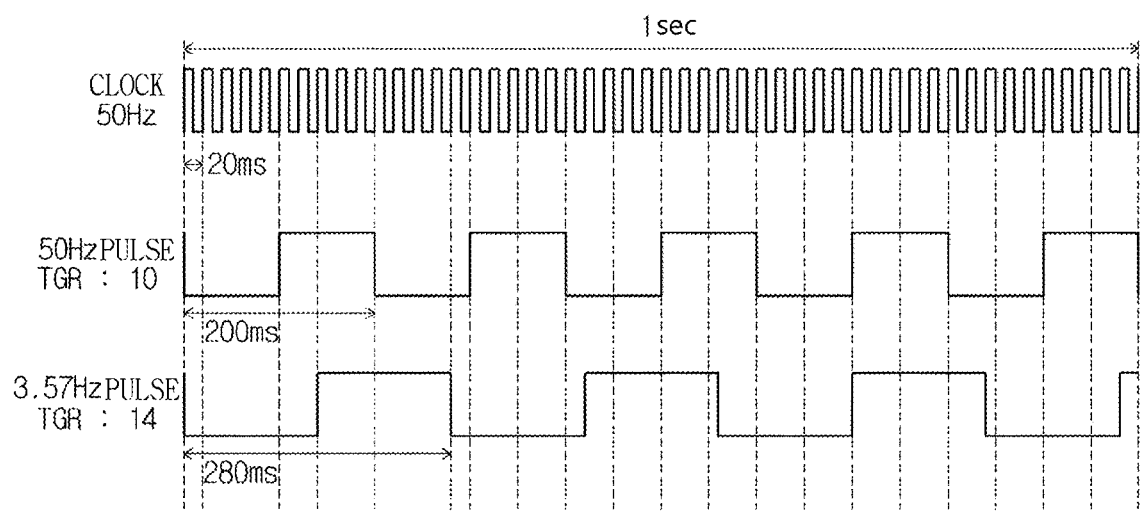
FIG. 2 is a waveform diagram showing an example of a pulse output by using the PLC positioning system of FIG. 1.

FIG. 2 is a waveform diagram showing an example of a pulse output by using the PLC positioning system of FIG. 1.

Referring to FIG. 2, since a clock cycle is 20 ms in the case of the MPU using 50 Hz clock, an output pulse cycle that may be set is a multiple of 20 ms, such as 20 ms, 40 ms, 60 MS or so.

Thus, a pulse of which the output frequency is 5 Hz may be implemented by generating a pulse at 200 ms intervals and in this case, since the 200 ms may be generated by counting ten clocks, it is possible to generate a pulse every 200 ms when a timer general register (TGR) value is set to 10.

Also, a pulse of which the output frequency is 3.75 Hz may be implemented by generating a pulse at 280 ms intervals and in this case, since the 280 ms may be generated by counting 14 clocks, it is possible to generate a pulse every 280 ms when a TGR value is set to 14.

As such, since the cycle of a pulse output through the MPU is a multiple of the cycle of an MPU clock, there is a limitation in that it is difficult to generate a pulse of which the cycle is not a multiple of a clock cycle.

That is, in a system having a 50 Hz clock, it is possible to generate five pulses for one second (5 Hz) but it is difficult to generate three pulses for one second (3 Hz).

A pulse should be generated every 333.33 ms in order to generate three pulses for one second but when a system CPU clock having a 20 ms (50 Hz) cycle is used, a pulse cycle may be set only to a multiple of a clock cycle, such as 320 ms or 340 ms.

Thus, when a pulse cycle is 320 ms, 3.125 pulses are output for one second, and when the pulse cycle is 340 ms, 2.941 pulses are output for one second, so it is difficult to generate a pulse of which the frequency is 3 Hz.

Thus, the present invention provides a method of outputting a positioning pulse by a PLC that may compensate for the cycle of the positioning pulse at a certain interval to minimize the difference between the desired cycle of the positioning pulse and the actual output cycle even when a desired pulse cycle is not a multiple of a clock pulse cycle.

Figure 3:
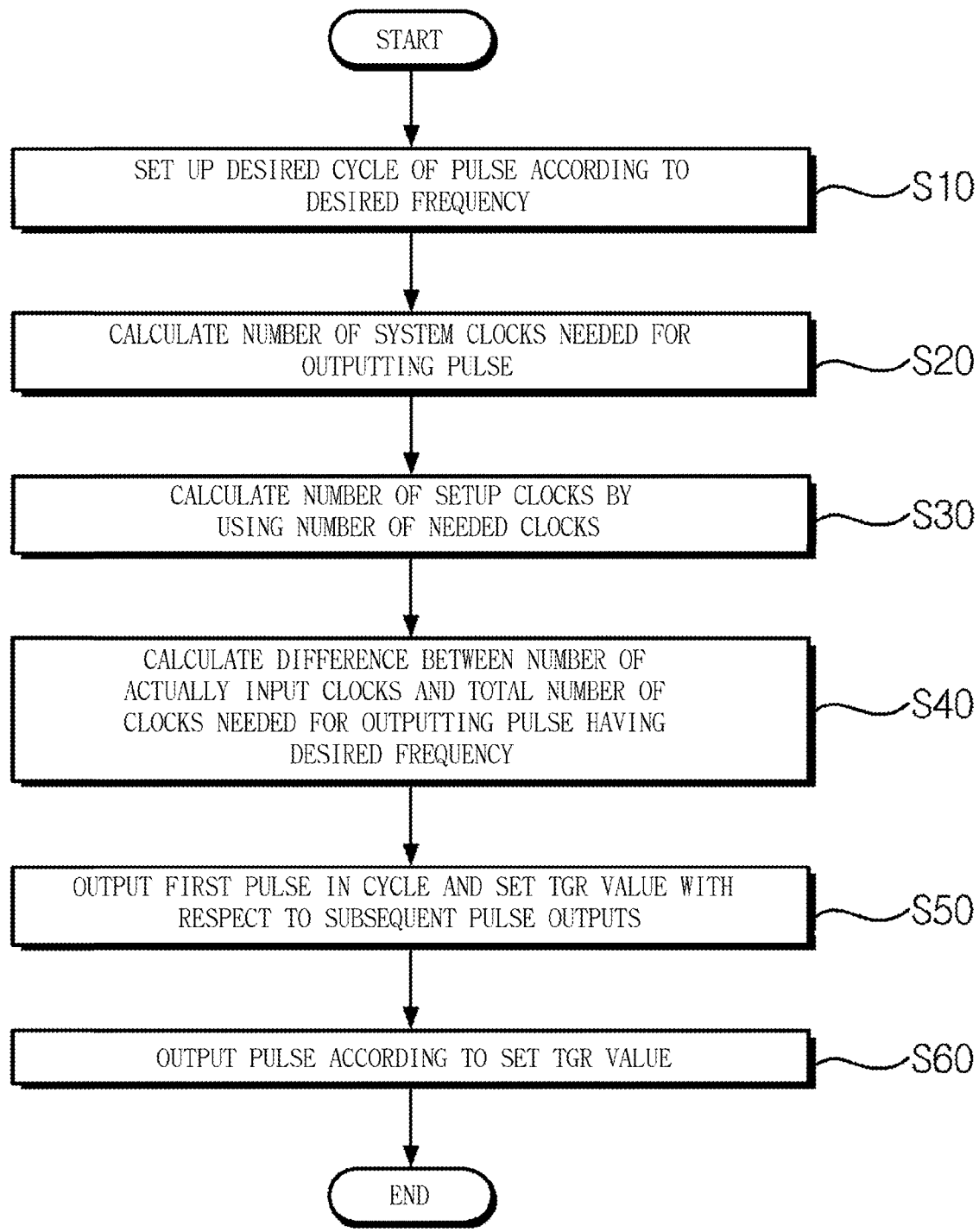
FIG. 3 is a flowchart of a method of outputting a positioning pulse by a PLC according to an embodiment.
Figure 4:
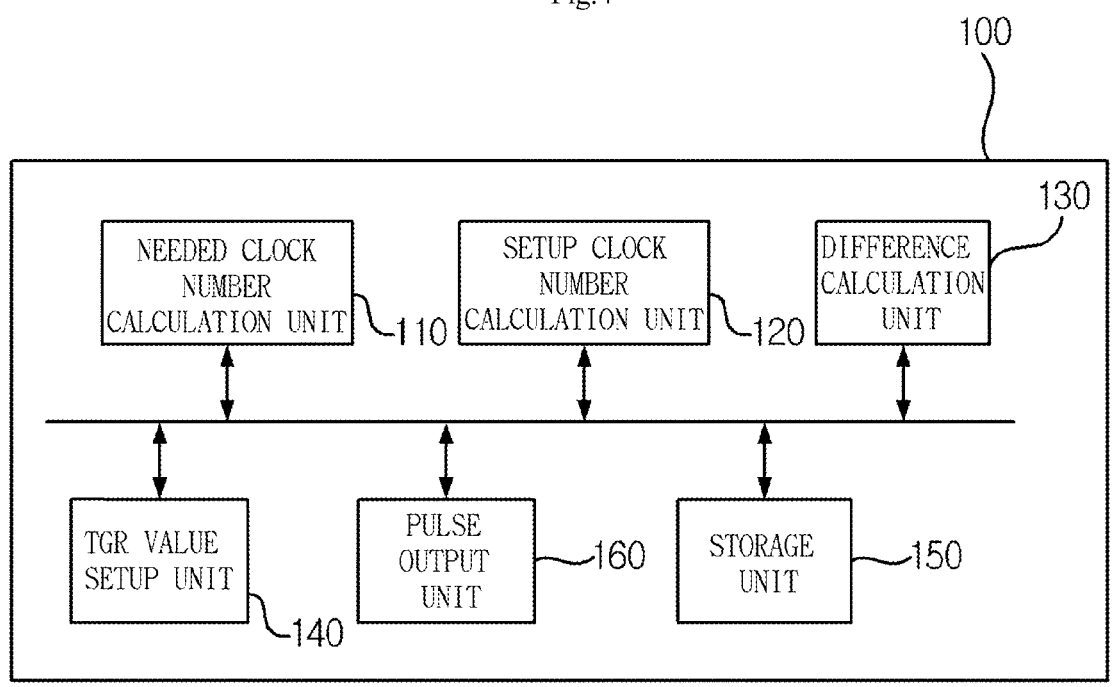
FIG. 4 is a schematic diagram of a device for implementing a method of outputting a positioning pulse by a PLC according to an embodiment.
Figure 5:
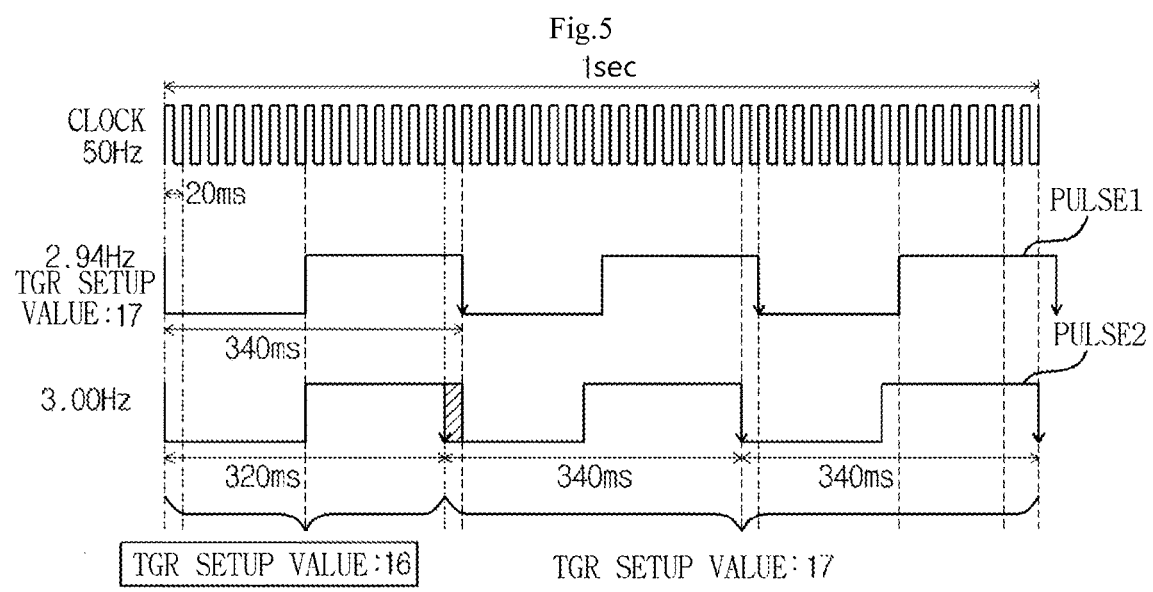
FIG. 5 is a waveform diagram for comparing, the waveform of a pulse compensated for and output according to a method of outputting a positioning pulse by a PLC according to an embodiment of the present invention, with the waveform of a pulse output without compensation.

FIG. 3 is a flowchart of a method of outputting the positioning pulse by a PLC according to an embodiment, FIG. 4 is a schematic diagram of a device for implementing a method of outputting the positioning pulse by a PLC according to an embodiment, FIG. 5 is a waveform diagram for comparing, the waveform of a pulse compensated for and output according to a method of outputting the positioning pulse by a PLC according to an embodiment of the present invention, with the waveform of a pulse output without compensation, and FIG. 6 represents values calculated in each step for outputting a pulse according to an embodiment of the present invention.

In the following, the method of outputting the positioning pulse by the PLC according to an embodiment is described with reference to FIGS. 3 to 6.

Referring to FIG. 4, a device for implementing the method of outputting the positioning pulse by the PLC according to an embodiment of the present invention (hereinafter, referred to as a "positioning pulse output device") 100 may include a needed clock number calculation unit 110, a setup clock number calculation unit 120, an difference calculation unit 130, a TGR value setup unit 140, a pulse output unit 150, and a storage unit 160, but the present invention is not limited thereto and each component is classified according to a function. Thus, the present invention may be implemented to integrally process, by a control unit, all functions to be described below.

Firstly, the desired cycle of an output pulse according to the desired frequency of a pulse to be output through the MPU is set in step S10.

When the desired frequency of a pulse to be output through the MPU is 3 Hz, a desired cycle is 333.33 ms and thus 333.33 ms is set as the desired cycle.

In this case, the desired cycle may be set up by a system setup or directly by a system designer, and when the desired frequency is set up, the MPU may automatically calculate and set up the desired cycle.

A system clock frequency, the desired frequency and the desired cycle may be stored in the storage unit 160.

Next, the number of system clocks needed for outputting a pulse is calculated in step S20. In this case, the number of needed clocks may be calculated by the needed clock number calculation unit 110 and a calculated, the number of needed clocks calculated may be stored in the storage unit 160.

The number of system clocks needed for outputting a pulse may be calculated by dividing the number of system clocks by a desired frequency, such as by dividing 50 Hz by 3 Hz when the number of system clocks is 50 Hz. Thus, 16.67 clocks are needed.

That is, when a pulse is output every 16.67 clocks, a pulse having a frequency of 3 Hz is output, but since a value that may be set up for the TGR is an integer, it is impossible to set 16.67 as a TGR value.

Thus, after step S20 of calculating the needed clock number, the number of clocks that may be set up for the TGR by using the number of system clocks needed for outputting a pulse is calculated in step S30.

In this case, the number of setup clocks that may be set up for the TGR may be obtained by rounding off the needed clock number, setup clock number calculation may be performed by the setup clock number calculation unit 120, and the number of setup clocks calculated may be stored in the storage unit 160.

Thus, 17 obtained by rounding off 16.67 calculated in step S20 of calculating the number of needed clocks is the number of setup clocks.

Next, a difference between the number of actually input clocks and a total number of clocks needed for outputting a pulse having a desired frequency when the number of setup clocks is applied is calculated in step S40.

In this case, it is possible to obtain a clock difference by subtracting the total number of needed clocks from the number of actually input clocks (the number of system clocks), clock difference calculation may be performed by the difference calculation unit 130, and a calculated clock difference may be stored in the storage unit 160.

Thus, since the number of setup clocks is 17 and the number of system clocks needed for outputting a pulse, the total number of clocks needed for outputting a frequency of 3 Hz, the desired frequency may be obtained by multiplying the number of setup clocks by the desired frequency. Thus, the number of needed clocks is 51 (=17×3).

Also, since the number of system clocks actually input for a certain cycle (one second) is 50, a clock difference is −1 obtained by subtracting the total number of needed clocks from the system clock value.

Next, a value obtained by subtracting the clock difference from the number of setup clocks is set as the TGR with respect to a first pulse output in a cycle, and the number of setup clocks is set as the TGR with respect to subsequent pulse outputs, in step S50.

Thus, in the present embodiment, 16 obtained by subtracting the clock difference from the number of setup clocks '17' is set as the TGR with respect to the first pulse output in a cycle (a first number of setup clocks), and the number of setup clocks '17' is set as the TGR with respect to subsequent pulse outputs (a second number of setup clocks).

Such a TGR value setup may be performed by the TGR value setup unit 140 and a set TGR value may be stored in the storage unit 160.

Next, a pulse is output according to a TGR value in step S60 and a pulse output may be performed by the pulse output unit 150.

That is, in step S60 of outputting the pulse, a first pulse is output according to a value obtained by subtracting a clock difference from the number of setup clocks and subsequently, a pulse is output according to the setup clock value.

As can be seen in FIG. 5, in the case of a pulse output without compensation (Pulse 1), such as when 17 is set as a TGR value, it is difficult to output three pulses in a certain cycle such as one second, but in the case of a pulse compensated for and output according to the method of outputting the positioning pulse by a PLC according to an embodiment (Pulse 2), a first output pulse is output according to the TGR value set to 16 and subsequent pulses are output according to the TGR value set to 17 so that it is possible to output three pulses in a certain cycle such as one second.

Thus, when the desired cycle of a positioning pulse is not a integer multiple of a system clock cycle, it is possible to compensate for the cycle of the positioning pulse at certain intervals and minimize the difference between the desired cycle of the positioning pulse and an actual output cycle, output the positioning pulse.

The present embodiment describes an example of compensating for a difference every one second and outputting three pulses but when a frequency has a unit of MHz, it is possible to compensate for at a unit of ms or less intervals, it is possible to output a pulse having an accurate frequency.

Although the method of outputting the positioning pulse by a PLC according to an embodiment is described, the scope of the present invention is not limited to particular embodiments and many alternatives, modifications and changes may be practiced within a scope obvious to a person skilled in the art to which the present invention pertains.

In the case of a pulse that is compensated for and output according to the method of outputting the positioning pulse by a PLC, a first output pulse is output according to a value obtained by subtracting a clock difference from a setup clock value, and subsequent pulses may be output according to the setup clock value.

Thus, when the desired cycle of a positioning pulse is not a multiple of a system clock cycle, it is possible to compensate for the cycle of the positioning pulse at certain intervals and minimize the difference between the desired cycle of the positioning pulse and an actual output cycle, output the positioning pulse.

Thus, embodiments and the accompanying drawings are intended not to limit but describe the technical spirit of the present invention, and the scope of the technical spirit of the present invention is not limited by such embodiments and the accompanying drawings. The protective scope of the present invention should be construed by the appended claims, and all technical spirits within the equivalent scope will be construed as being included in the scope of the right of the present invention.

What is claimed is:

1. A method of outputting a positioning pulse by a programmable logic controller (PLC), the method comprising:
   setting up the desired cycle of a pulse to be output;
   determining a number of needed clocks based on a number of system clocks and a desired frequency according to the desired cycle;
   determining a total number of needed clocks based on the number of needed clocks and the desired frequency;
   determining a clock difference based on the number of system clocks and the total number of needed clocks;
   determining a first number of setup clocks corresponding to a first output pulse in a certain cycle;
   determining a second number of setup clocks corresponding to pulses except for the first output pulse; and
   outputting a pulse based on the first number of setup clocks and the second number of setup clocks.

2. The method according to claim 1, wherein the number of needed clocks is determined by dividing the number of system clocks by the desired frequency.

3. The method according to claim 1, wherein when the number of needed clocks is not an integer, the number of clocks is changed to an integer.

4. The method according to claim 3, wherein the change of the number of needed clocks to the integer is performed by rounding off to the nearest tenth of the number of needed clocks.

5. The method according to claim 1, wherein the clock difference is determined by subtracting the total number of needed clocks from the number of system clocks.

6. The method according to claim 1, wherein the first number of setup clocks is determined by compensating for the clock difference from a value obtained by converting the number of needed clocks and the second number of setup clocks is determined to be a value obtained by converting the number of needed clocks.

7. The method according to claim 1, further comprising storing the number of system clocks, the number of desired clocks and the number of needed clocks in a storage unit.

8. The method according to claim 1, further comprising setting the first number of setup clocks and the second number of setup clocks as a timer general register (TGR) value.

9. A device of outputting a positioning pulse by a PLC, the device comprising:
   a needed clock calculation unit determining a number of needed clocks based on a number of desired clocks and a number of system clocks;
   a difference calculation unit determining a total number of needed clocks based on the number of needed clocks and the number of desired clocks and determining a clock difference based on the number of system clocks and the total number of needed clocks;
   a TGR value setup unit, setting a first number of setup clocks corresponding to a first output pulse in a cycle and a second number of setup clocks corresponding to pulses except for the first output pulse, as a TGR value; and
   a pulse output unit outputting a pulse based on the first number of setup clocks and the second number of setup clocks.

10. The device according to claim 9, wherein the needed clock number calculation unit determines the number of needed clocks by dividing the number of system clocks by a desired frequency.

11. The device according to claim 9, wherein the setup clock number calculation unit changes the number of needed clocks to an integer when the number of needed clocks is not an integer.

12. The device according to claim 11, wherein the setup clock number calculation unit changes the number of needed clocks to an integer by rounding off to the nearest tenth of the number of needed clocks.

13. The device according to claim 9, wherein the difference calculation unit determines the clock difference by subtracting the total number of needed clocks from the number of system clocks.

14. The device according to claim 9, wherein the TGR value setup unit compensates for the clock difference from a value obtained by converting the number of needed clocks, setting the first number of setup clocks as a TGR value, and setting, the second number of setup clocks, a value obtained by converting the number of needed clocks, as the TGR value.

15. The device of claim 9, further comprising a storage unit storing the number of system clocks, the number of desired clocks and the number of needed clocks in a storage unit.

\* \* \* \* \*